(12) United States Patent
Nakaya

(10) Patent No.: US 9,299,424 B2
(45) Date of Patent: Mar. 29, 2016

(54) RECONFIGURABLE CIRCUIT AND METHOD FOR REFRESHING RECONFIGURABLE CIRCUIT

(75) Inventor: Shogo Nakaya, Tokyo (JP)

(73) Assignee: NEC CORPORATION, Tokyo (JP)

(*) Notice: Subject to any disclaimer, the term of this patent is extended or adjusted under 35 U.S.C. 154(b) by 192 days.

(21) Appl. No.: 14/002,874

(22) PCT Filed: Oct. 26, 2011

(86) PCT No.: PCT/JP2011/005972
§ 371 (c)(1),
(2), (4) Date: Sep. 3, 2013

(87) PCT Pub. No.: WO2012/117467
PCT Pub. Date: Sep. 7, 2012

(65) Prior Publication Data
US 2013/0335116 A1 Dec. 19, 2013

(30) Foreign Application Priority Data
Mar. 2, 2011 (JP) ................................ 2011-044964

(51) Int. Cl.
*G11C 13/00* (2006.01)
*G11C 11/56* (2006.01)

(52) U.S. Cl.
CPC ............ *G11C 13/0002* (2013.01); *G11C 11/56* (2013.01); *G11C 13/004* (2013.01);
(Continued)

(58) Field of Classification Search
CPC .......... G11C 13/0002; G11C 13/0011; G11C 13/0069; G11C 13/0033; G11C 13/004; G11C 11/56; G11C 2213/74; G11C 2213/79; G11C 2013/0076; H03K 19/17736; H03K 19/17728; H03K 19/17748
USPC .................... 326/37–41, 47; 365/158, 185.03, 365/185.22, 185.21
See application file for complete search history.

(56) References Cited

U.S. PATENT DOCUMENTS

| 8,872,542 B2* | 10/2014 | Sakimura | ........... G11C 13/0004 326/38 |
| 2004/0114427 A1* | 6/2004 | Hamaguchi | ........ G11C 11/5678 365/158 |
| 2013/0176051 A1* | 7/2013 | Nakaya | ................. H01L 27/101 326/38 |

FOREIGN PATENT DOCUMENTS

| JP | 2004-185753 A | 7/2004 |
| JP | 2006-024714 A | 1/2006 |

(Continued)

OTHER PUBLICATIONS

International Search Report for PCT Application No. PCT/JP2011/005972 mailed on Dec. 20, 2011.

(Continued)

*Primary Examiner* — Alexander H Taningco
*Assistant Examiner* — Seokjin Kim

(57) ABSTRACT

A reconfigurable circuit (10) according to the present invention includes: a switching element group that is formed by a plurality of switching elements (1), an ON state and an OFF state of the switching element being rewritable in accordance with a resistive state; and a configuration controller (60) that senses the resistive state of each of the switching elements and programs each switching element, wherein the configuration controller (60) senses the resistive state of each switching element (1) by applying an inspection-purpose voltage across the opposite electrodes of the switching element (1), and when the sensed resistive state is abnormal, the configuration controller applies a programming voltage across the opposite electrodes of the switching element such that the resistive state of the switching element becomes the programmed resistive state.

16 Claims, 11 Drawing Sheets

(52) U.S. Cl.
CPC ........ *G11C13/0011* (2013.01); *G11C 13/0033* (2013.01); *G11C 13/0069* (2013.01); *G11C 2013/0076* (2013.01); *G11C 2213/74* (2013.01); *G11C 2213/79* (2013.01)

(56) References Cited

FOREIGN PATENT DOCUMENTS

| JP | 2006-190376 | A  | 7/2006  |
|----|-------------|----|---------|
| JP | 2006-202383 | A  | 8/2006  |
| JP | 2007-329760 | A  | 12/2007 |
| JP | 2008-53433  | A  | 3/2008  |
| JP | 4356542     | B2 | 11/2009 |
| WO | 2007/111319 | A1 | 10/2007 |
| WO | 2009/066500 | A1 | 5/2009  |

OTHER PUBLICATIONS

Japanese Office Action for JP Application No. 2013-502051 mailed on Jul. 7, 2015 with English Translation.

\* cited by examiner

| CV1 OR CV2 | P |
|---|---|
| 10 | Von |
| 01 | Voff |
| 11 | Vmdl |
| 00 | Vgnd |

Fig. 3

| H | C | M | CV1 | CV2 |
|---|---|---|-----|-----|
| 1 | X | X | Vmdl | Vmdl |
| 0 | 0 | 0 | Vmdl | Vgnd |
| 0 | 0 | 1 | Vgnd | Vmdl |
| 0 | 1 | 0 | Von | Vgnd |
| 0 | 1 | 1 | Vgnd | Voff |

Fig. 5

| C | M | R |
|---|---|---|
| 0 | 0 | Vth |
| 0 | 1 | Vtl |
| 1 | 0 | Vph |
| 1 | 1 | Vpl |

Fig. 6

| C | RM |
|---|---|
| 0 | Vtm |
| 1 | Vpm |

RECONFIGURABLE CIRCUIT AND METHOD FOR REFRESHING RECONFIGURABLE CIRCUIT

This application is a National Stage Entry of PCT/JP2011/005972 filed Oct. 26, 2011, which claims priority from Japanese Patent Application 2011-044964 filed Mar. 2, 2011, the contents of all of which are incorporated herein by reference, in their entirety.

TECHNICAL FIELD

The present invention relates to a reconfigurable circuit and a method for refreshing a reconfigurable circuit. In particular, the present invention relates to a reconfigurable circuit using resistive rewritable non-volatile switching elements whose ON and OFF states can be rewritten in accordance with a resistive state, and a method for refreshing such a reconfigurable circuit.

BACKGROUND ART

In recent years, a resistive rewritable non-volatile switching element whose ON and OFF states can be rewritten in accordance with a resistive state (hereinafter referred to also as a resistive switching element) has been developed (see Patent Literature 1).

FIGS. 13A to 13C are diagrams for explaining such a resistive rewritable non-volatile switching element. As shown in FIG. 13A, a resistive switching element 101 is structured by an anode 110 being a first electrode, a cathode 112 being a second electrode, and an ionic conductor 111 interposed between the anode 110 and the cathode 112.

The anode 110 is an electrode that supplies metallic ions to the ionic conductor 111, and is chiefly made of copper and others. The cathode 112 is an electrode that does not supply metallic ions to the ionic conductor 111, and platinum or the like is used therefor. The ionic conductor 111 has a characteristic of allowing the metallic ions supplied from the anode 110 to move, and tantalum oxide or the like is used therefor.

FIG. 13B shows the case where the resistive switching element 101 is in the ON state, that is, the state where electrical conduction is established across the opposite electrodes. By applying a programming voltage Von to the anode 110 and applying a ground voltage (hereinafter referred to also as the ground voltage) Vgnd to the cathode 112, the resistive switching element 101 can be set to the ON state.

FIG. 13C shows the case where the resistive switching element 101 is in the OFF state, that is, the state where the opposite electrodes are electrically disconnected from each other. By applying the ground voltage Vgnd to the anode 110 and applying a programming voltage Voff to the cathode 112, the resistive switching element 101 can be set to the OFF state.

Such a process of setting the resistive switching element 101 to the ON state or the OFF state is referred to as programming. Further, the voltage applied to the resistive switching element 101 when the programming is performed is referred to as the programming voltage. Note that the ON state and OFF state of the resistive switching element 101 are retained even when the power supply is shut down.

Further, Patent Literature 2 discloses a reconfigurable circuit using such resistive switching elements. The reconfigurable circuit disclosed in Patent Literature 2 has a programmable cell array, and the programmable cells have function blocks and programmable interconnects. The function blocks are circuits that realize various logical operation functions in accordance with any program. Further, the programmable interconnects are each an interconnect connecting between the function blocks in accordance with any program. Patent Literature 2 discloses an example in which such resistive rewritable non-volatile switching elements are used as elements realizing the programmability.

With the reconfigurable circuit disclosed in Patent Literature 2, a circuit can be reconfigured by applying the programming voltage to each of the resistive switching elements structuring the reconfigurable circuit, to switch the ON state and OFF state of the resistive switching elements to the desired state.

CITATION LIST

Patent Literatures

Patent Literature 1: Japanese Unexamined Patent Application Publication No. 2008-53433
Patent Literature 2: Japanese Patent No. 4356542

SUMMARY OF INVENTION

Technical Problem

However, the reconfigurable circuit using the resistive switching elements such as those explained in Background Art is associated with the following problem: when the reconfigurable circuit is continuously used for a long period at the power supply voltage lower than the programming voltage Von, the programming state of the resistive switching element gradually deteriorates. Such gradual deterioration of the programming state of the resistive switching elements poses problems such as a reduction in performance of the circuit, an increase in power consumption, and a malfunction of the circuit. Accordingly, the reconfigurable circuit using the resistive switching elements is associated with the problem of poor stability.

Taking into consideration of the foregoing problem, an object of the present invention is to provide a reconfigurable circuit that drives stably despite use of resistive rewritable non-volatile switching elements, and a method for refreshing such a reconfigurable circuit.

Solution to Problem

A reconfigurable circuit according to the present invention includes: a switching element group that is formed by a plurality of switching elements disposed in a manner of a two-dimensional array, a resistive state of each of the switching elements being programmable in accordance with a voltage applied across opposite electrodes of the switching element, an ON state and an OFF state of the switching element being rewritable in accordance with the resistive state; and a configuration controller that senses the resistive state of each of the switching elements and programs each switching element, wherein the configuration controller senses the resistive state of each switching element by applying an inspection-purpose voltage across the opposite electrodes of the switching element, the inspection-purpose voltage substantially maintaining the ON state and the OFF state of the switching element unchanged, and when the sensed resistive state is abnormal, the configuration controller applies a programming voltage across the opposite electrodes of the switching element such that the resistive state of the switching element becomes the programmed resistive state.

A method for refreshing a reconfigurable circuit according to the present invention, wherein the reconfigurable circuit includes: a switching element group that is formed by a plurality of switching elements disposed in a manner of a two-dimensional array, a resistive state of each of the switching elements being programmable in accordance with a voltage applied across opposite electrodes of the switching element, an ON state and an OFF state of the switching element being rewritable in accordance with the resistive state; and a configuration controller that senses the resistive state of each of the switching elements and programs each switching element, wherein the configuration controller senses the resistive state of each switching element by applying an inspection-purpose voltage across the opposite electrodes of the switching element, the inspection-purpose voltage substantially maintaining the ON state and the OFF state of the switching element unchanged, and when the sensed resistive state is abnormal, the configuration controller applies a programming voltage across the opposite electrodes of the switching element such that the resistive state of the switching element becomes the programmed resistive state.

Advantageous Effects of Invention

The present invention makes it possible to provide a reconfigurable circuit that can stably drive despite use of resistive rewritable non-volatile switching elements, and a method for refreshing such a reconfigurable circuit.

BRIEF DESCRIPTION OF DRAWINGS

FIG. 3 is a table showing the relationship between voltage control signals CV1 and CV2 and an output P of the programming driver.

FIG. 5 is a table showing the relationship between a mode signal H, a configuration signal C and program state information M, and voltages output from the programming driver in accordance with the voltage control signals CV1 and CV2.

FIG. 6 is a table showing a reference signal R output from a reference signal generating unit in accordance with the configuration signal C and the program state information M.

DESCRIPTION OF EMBODIMENTS

First Embodiment

Exemplary embodiments according to the present invention are explained hereinafter with reference to the drawings.

Figure 1:
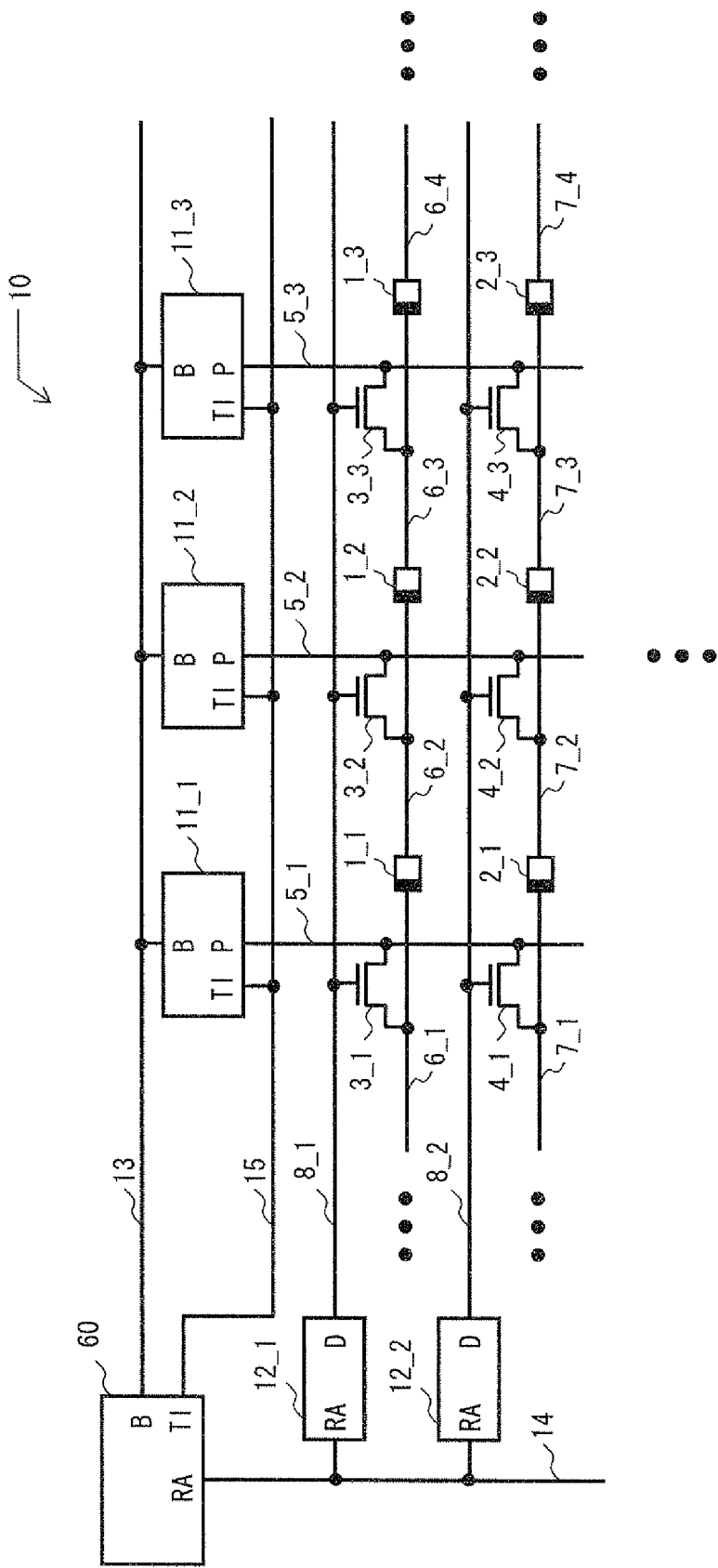
FIG. 1 is a circuit diagram showing a reconfigurable circuit according to a first embodiment.

FIG. 1 is a circuit diagram showing a reconfigurable circuit 10 according to a first embodiment. In the reconfigurable circuit 10 shown in FIG. 1, a plurality of resistive switching elements 1_1 to 1_3, and 2_1 to 2_3 are disposed in a manner of a two-dimensional array. The resistive switching elements 1_1 to 1_3, and 2_1 to 2_3 are each capable of programmably setting the connection among wirings. In FIG. 1, for example the resistive switching element 1_1 is connected between a wiring 6_1 and a wiring 6_2, and capable of switching between the state where electrical conduction is established between the wiring 6_1 and the wiring 6_2 and the state where they are electrically disconnected from each other.

That is, a resistive switching element 1_$i$ is connected between a wiring 6_$i$ and a wiring 6_$i$+1, and capable of switching between the state where electrical conduction is established between the wiring 6_$i$ and the wiring 6_$i$+1 and the state where the wiring 6_$i$ and the wiring 6_$i$+1 are electrically disconnected from each other. Similarly, a resistive switching element 2_$i$ is connected between a wiring 7_$i$ and a wiring 7_$i$+1, and capable of switching between the state where electrical conduction is established between the wiring 7_$i$ and the wiring 7_$i$+1 and the state where the wiring 7_$i$ and the wiring 7_$i$+1 are electrically disconnected from each other. Note that i is an integer equal to or greater than 1. Further, for example, when the resistive switching elements 1_$i$ are collectively referred to, the resistive switching elements 1_$i$ may be simply referred to as a resistive switching element 1 without use of i. The same holds true for other constituents.

Figure 13A:
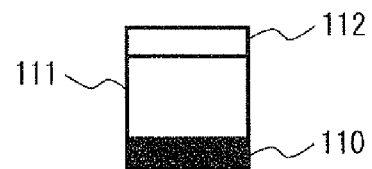
FIG. 13A is a diagram showing a resistive rewritable non-volatile switching element.
Figure 13B:
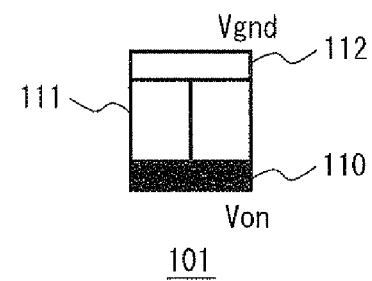
FIG. 13B is a diagram showing a resistive rewritable non-volatile switching element programmed to the ON state.
Figure 13C:
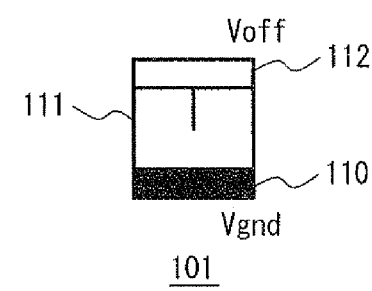
FIG. 13C is a diagram showing a resistive rewritable non-volatile switching element programmed to the OFF state.

Further, the resistive switching elements 1_1 to 1_3, and 2_1 to 2_3 used in the reconfigurable circuit according to the present embodiment are each a switching element whose resistive state can be programmed in accordance with a voltage applied across the opposite electrodes, and whose ON and OFF states can be rewritten according to the resistive state. The resistive switching elements 1_1 to 1_3, and 2_1 to 2_3 are each structured basically similarly to the resistive switching element 101 shown in FIGS. 13A to 13C. That is, the resistive switching elements 1_1 to 1_3, and 2_1 to 2_3 have polarity. The electrode represented by a bold line is the anode, and the opposite electrode is the cathode. Then, the resistive switching element is programmed to a low resistance state (ON state) by applying a voltage equal to or greater than a prescribed positive voltage (ON voltage Von) as the programming voltage to the anode of the resistive switching element and applying the ground voltage Vgnd to the cathode. Further, the resistive switching element is programmed to a high resistance state (OFF state) by applying the ground voltage Vgnd to the anode of the resistive switching element and applying a voltage equal to or greater than a prescribed positive voltage (OFF voltage Voff) as the programming voltage to the cathode, to thereby allow a current equal to or greater than a prescribed current to flow from the cathode to the anode. Here, the ON voltage Von and the OFF voltage Voff satisfy the relationship of, for example, Von>Voff.

In the present embodiment, in order to apply the programming voltage to the resistive switching elements 1_1 to 1_3, and 2_1 to 2_3, a configuration controller 60, programming drivers 11_1 to 11_3, programming decoders 12_1 and 12_2, programming lines 5_1 to 5_3, gate lines 8_1 and 8_2, and programming transistors (for example, N-type transistors) 3_1 to 3_3, and 4_1 to 4_3 are provided.

For example, the source of the programming transistor 3_1 is connected to the wiring 6_1 on the anode side of the resistive switching element 1_1; the drain thereof is connected to the programming line 5_1; and the gate thereof is connected to the gate line 8_1. The source of the programming transistor 3_2 is connected to the wiring 6_2 on the cathode side of the resistive switching element 1_1 (i.e., in other words, on the anode side of the resistive switching element 1_2); the drain thereof is connected to the programming line 5_2; and the gate thereof is connected to the gate line 8_1. The other programming transistors are arranged in a similar manner.

The programming drivers 11_i each receive a programming control signal B output from the configuration controller 60 via an line 13, and each provide an output P (the programming voltage) corresponding to the programming control signal B to the programming lines 5_i.

The programming decoders 12_i each receive a row address signal RA output from the configuration controller 60 via an line 14. The programming decoders 12_i each have a unique ID. Only the programming decoder whose ID agrees with the row address signal RA sets the gate lines 8_i to the high level, and the other programming decoders set the gate lines 8_i to the low level.

In the reconfigurable circuit 10 shown in FIG. 1, for example, in order to program the resistive switching element 1_1, the programming voltage must be applied across the opposite electrodes of the resistive switching element 1_1. In this case, firstly, the configuration controller 60 outputs a row address signal RA indicative of the unique ID of the programming decoder 12_1. The programming decoder 12_1 supplied with the row address signal RA sets the gate line 8_1 to the high level, thereby setting the programming transistors 3_i of one row to which the resistive switching element 1_1 belongs to the ON state. At this time, the gate lines 8_j (j being an integer other than 1) other than the gate line 8_1 are set to the low level, whereby the programming transistors other than the programming transistor 3i are set to the OFF state.

Next, the configuration controller 60 sets the programming drivers 11_1 and 11_2 to the programming state. The programming drivers 11_1 and 11_2 supply the programming voltage to the opposite electrodes of the resistive switching element 1_1 via the programming lines 5_1 and 5_2. At this time, the programming drivers 11_k (k being an integer except for 1 and 2) except for the programming drivers 11_1 and 11_2 are set to the high-impedance state.

Here, to set the programming state means, when the resistive switching element 1_1 is to be programmed to the ON state, to set the output P of the programming driver 11_1 leading to the anode side to the ON voltage Von and to set the output P of the programming driver 11_2 leading to the cathode side to the ground voltage Vgnd. Further, when the resistive switching element 1_1 is to be programmed to the OFF state, it means to set the output P of the programming driver 11_1 leading to the anode side to the ground voltage Vgnd and to set the output P of the programming driver 11_2 leading to the cathode side to the OFF voltage Voff.

Figure 2:
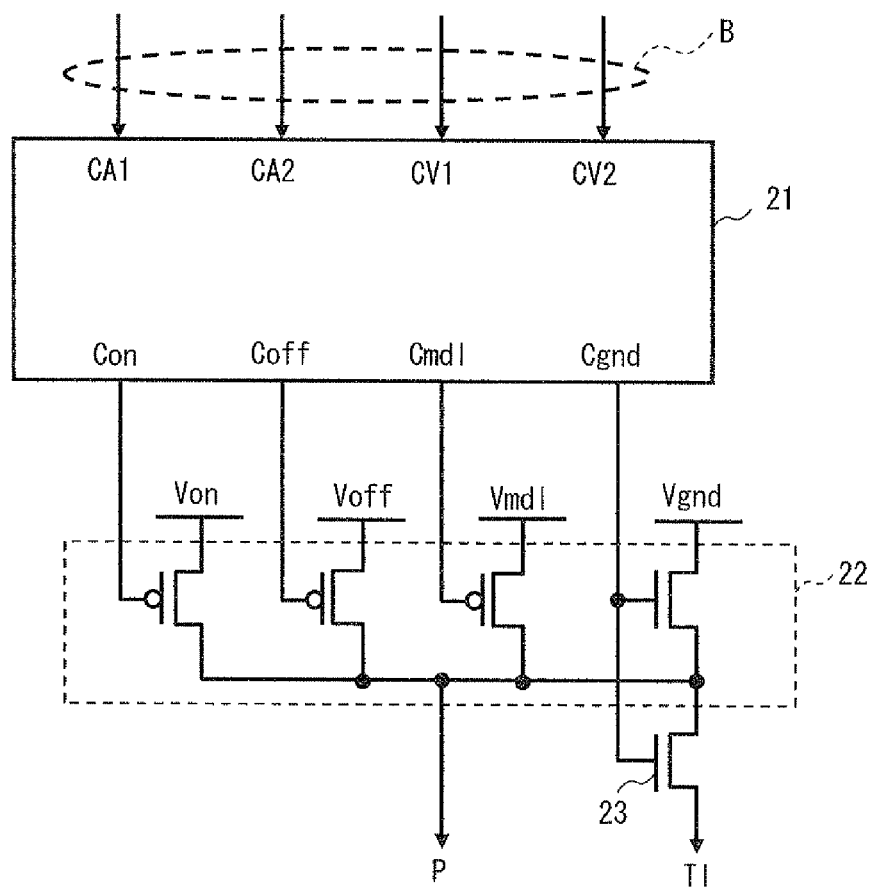
FIG. 2 is a circuit diagram showing a programming driver included in the reconfigurable circuit according to the first embodiment.

Here, the output states of the programming drivers 11_i are controlled using the programming control signal B output from the configuration controller 60. FIG. 2 is a circuit diagram showing the programming driver 11 included in the reconfigurable circuit according to the present embodiment. The programming driver 11 includes a driver decoder 21, a power supply control transistor 22 and a test transistor 23. The programming control signal B includes column addresses CA1 and CA2 and voltage control signals CV1 and CV2.

The programming drivers 11_i each have a unique ID. The output P of the driver having the ID agreeing with the column address CA1 is controlled by the voltage control signal CV1, and the output P of the driver having the ID agreeing with the column address CA2 is controlled by the voltage control signal CV2. The programming drivers having the IDs not agreeing with the column addresses CA1 and CA2 enter the high-impedance state. The driver decoder 21 controls the power supply control transistor 22 in accordance with the voltage control signals CV1 and CV2 of the programming control signal B. That is, as the output P of the programming driver 11, a voltage in accordance with the voltage control signals CV1 and CV2 is output.

Figure 3:
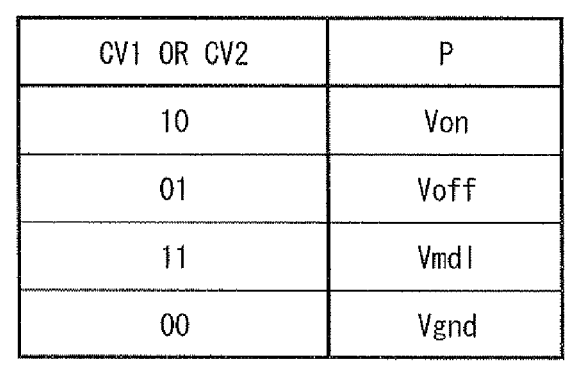

FIG. 3 is a table showing the relationship between the voltage control signals CV1 and CV2 and the output P of the programming driver 11. As shown in FIG. 3, the programming driver 11 provides "Von" as the output P when the voltage control signal CV1 or CV2 is "10"; "Voff" as the output P when "01"; "Vmdl" as the output P when "11"; and "Vgnd" as the output P when "00". Note that, as the voltage used for programming, a middle voltage Vmdl is used in addition to Von, Voff and Vgnd. Here, the middle voltage Vmdl is a voltage approximately ½ as great as Von. When this voltage is applied across the opposite electrodes of the resistive switching element, the program state of the resistive switching element does not change.

Further, when the output P of the programming driver 11 is Vgnd, the test transistor 23 enters the ON state. Thus, the programming driver 11 can supply the voltage of the node P (that is, the voltage of the electrode to which Vgnd is applied out of the electrodes of the resistive switching element) to a test input TI of the configuration controller 60 in FIG. 1. By monitoring the voltage on the Vgnd side in the programming state, the programming state (resistive state) of the resistive switching element can be grasped.

Still further, the configuration controller 60 included in the reconfigurable circuit according to the present embodiment can refresh the resistive switching elements. Here, to refresh means to correct deterioration of the resistive switching elements. It is desirable that the refresh process is performed upon power-on of the reconfigurable circuit, or in a period of a certain length in which no operation is performed. Thus, the reconfigurable circuit can be used stably for a long period without the refresh operation becoming very obvious.

Figure 4:
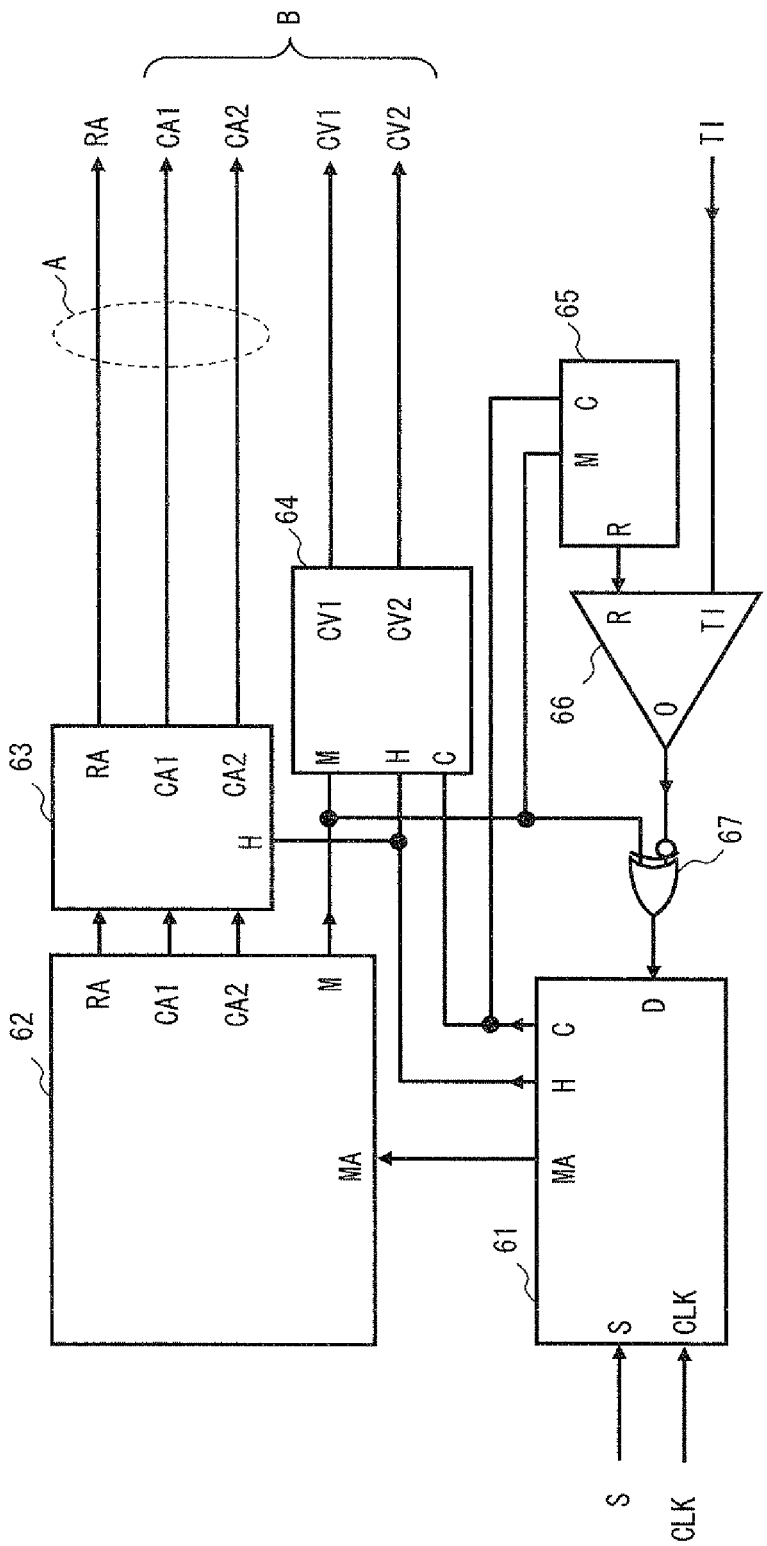
FIG. 4 is a circuit diagram showing a configuration controller included in the reconfigurable circuit according to the first embodiment.

FIG. 4 shows the configuration controller 60 included in the reconfigurable circuit 10 according to the present embodiment. The configuration controller 60 shown in FIG. 4 includes a control unit (control means) 61, a configuration memory (address generating means) 62, an address gate 63, a voltage control unit (voltage control means) 64, a reference signal generating unit 65, a comparator 66, and an exclusive OR gate 67. Here, the reference signal generating unit 65, the comparator 66 and the exclusive OR gate 67 structure sensing means for sensing the resistive state of the resistive switching elements.

The control unit 61 operates in synchronization with a clock signal CLK supplied to an input terminal CLK. Further, the control unit 61 starts to operate when a start signal S supplied to an input terminal S becomes the high level. The control unit 61 outputs: a memory address MA to the configuration memory 62; a mode signal H to the address gate 63 and the voltage control unit 64; and a configuration signal C to the voltage control unit 64 and the reference signal generating unit 65.

The configuration memory 62 retains word data corresponding to the resistive switching elements included in the reconfigurable circuit. The word data includes address information RA, CA1 and CA2 required for programming corresponding resistive switching elements, and program state information M indicative of the program state (ON state or OFF state) of the resistive switching elements. The address information RA, CA1 and CA2 is supplied to the programming driver 11 and the programming decoder 12 via the address gate 63.

The configuration memory 62 supplies the address information RA, CA1 and CA2 required for programming the resistive switching element corresponding to the memory address MA supplied from the control unit 61 to the address gate 63, and supplies the program state information M corresponding to the resistive switching element to the voltage control unit 64 and one terminal of the exclusive OR gate 67.

The address gate 63 outputs the address information RA, CA1 and CA2 in accordance with the mode signal H output from the control unit 61. Specifically, when H=1 (high level), the address gate 63 outputs, to the programming decoder 12, a row address RA that allows all the programming transistors to enter the ON state, and outputs, to the programming driver 11, the column addresses CA1 and CA2 that allow all the programming drivers 11 to output the middle voltage Vmdl. Further, when H=0 (low level), the address gate 63 outputs the address information RA, CA1 and CA2 having been output from the configuration memory 62 as they are. Here, the address information RA, CA1 and CA2 is referred to as the programming address A.

The voltage control unit 64 generates the voltage control signals CV1 and CV2 in accordance with the mode signal H and the configuration signal C output from the control unit 61, and the program state information M output from the configuration memory 62, and outputs the voltage control signals CV1 and CV2 to the programming driver 11. FIG. 5 is a table showing the relationship between the mode signal H, the configuration signal C and the program state information M, and the voltage output from the programming driver 11 in accordance with the voltage control signals CV1 and CV2. Here, X means don't care.

When the mode signal H output from the control unit 61 is H=1, the middle state is entered; when H=0, the non-middle state is entered. Here, the middle state refers to the state where all the programming drivers 11 output the middle voltage Vmdl, and all the programming transistors enter the ON state. That is, in the middle state, the middle voltage Vmdl is applied across the opposite electrodes of every resistive switching element.

When the configuration signal C output from the control unit 61 is C=1, it corresponds to the programming mode of the resistive switching elements; when C=0, it corresponds to the inspection mode of the resistive switching elements.

When the program state information M is M=0, it means that the resistive switching element is in the ON state (low resistance state); when M=1, it means that the resistive switching element is in the OFF state (high resistance state).

In the inspection mode (C=0), an inspection-purpose voltage that does not substantially change the ON state and OFF state of a resistive switching element is applied across the opposite electrodes of the resistive switching element being the inspection target, to inspect whether the resistive state is normal or not. That is, the middle voltage Vmdl and the ground voltage Vgnd are applied across the opposite electrodes of the resistive switching element being the inspection target, to inspect whether or not the resistive state is normal. Here, though the middle voltage Vmdl is the voltage that does not change the resistive state of the resistive switching element, for further safety, it is desired to apply the voltage in the direction enhancing the program state of the resistive switching element. Accordingly, in FIG. 5, the direction of the applied voltage is changed in accordance with the program state information M indicative of the program state of the resistive switching element being the inspection target.

Note that, the column address CA1 and the voltage control signal CV1 correspond to the address and voltage control signal of the programming drivers 11_$i$ connected to the anode side of the resistive switching elements, and the column address CA2 and the voltage control signal CV2 correspond to the address and voltage control signal of the programming drivers 11_$i$+1 connected to the cathode side of the resistive switching elements.

In the programming mode (C=1), when the resistive switching element should be in the ON state (M=0), the output of the programming drivers 11_$i$ on the anode side is Von, and the output of the programming drivers 11_$i$+1 on the cathode side is Vgnd. On the other hand, when the resistive switching element should be in the OFF state (M=1), the output of the programming drivers 11_$i$ on the anode side is Vgnd, and the output of the programming drivers 11_$i$+1 on the cathode side is Voff. Here, the ON voltage Von and the OFF voltage Voff satisfy the relationship of, for example, Von>Voff.

The reference signal generating unit 65 shown in FIG. 4 generates a reference signal R in accordance with the configuration signal C output from the control unit 61 and the program state information M output from the configuration memory 62, and outputs the reference signal R to one of the input terminals of the comparator 66. FIG. 6 is a table showing the reference signal R that the reference signal generating unit 65 outputs in accordance with the configuration signal C and the program state information M.

The comparator 66 shown in FIG. 4 compares the voltage of the reference signal R and the voltage of the test input TI (the test voltage) with each other. The comparator 66 outputs a high-level signal when the voltage of the test input TI is higher, and outputs a low-level signal when the voltage of the test input TI is lower. Here, the voltage of the test input TI corresponds to the voltage of the electrode to which Vgnd is supplied, out of the electrodes of each resistive switching element.

In the inspection mode (C=0), when the resistive switching element being the inspection target should be in the ON state (M=0), if the voltage of the test input TI is higher than Vth (the first voltage), then it is determined to be normal. On the other hand, when the resistive switching element being the inspection target should be in the OFF state (M=1), if the voltage of the test input TI is lower than Vtl (the second voltage), then it is determined to be normal.

The exclusive OR gate 67 receives the program state information M at its one terminal and receives a signal being an inversion of the output of the comparator 66 at the other terminal. Then, the exclusive OR gate 67 outputs the exclusive OR of them. That is, when the resistive switching element being the inspection target should be in the ON state (M=0), if the voltage of the test input TI is higher than Vth, then it is normal. Therefore, the comparator 66 outputs a high-level signal. In this case, the exclusive OR gate 67 outputs to the control unit 61 a low-level signal as an inspection result signal D. On the other hand, when the resistive switching element being the inspection target should be in the ON state (M=0), if the voltage of the test input TI is lower than Vth, then the comparator 66 outputs a low-level signal (the abnormal state). In this case, the exclusive OR gate 67 outputs to the control unit 61 a high-level signal as the inspection result signal D.

Further, when the resistive switching element being the inspection target should be in the OFF state (M=1), if the voltage of the test input TI is lower than Vtl, then it is normal. Therefore, the comparator 66 outputs a low-level signal. In this case, the exclusive OR gate 67 outputs to the control unit 61 a low-level signal as the inspection result signal D. On the other hand, when the resistive switching element being the inspection target should be in the OFF state (M=1), if the voltage of the test input TI is higher than Vtl, then the comparator 66 outputs a high-level signal (the abnormal state). In this case, the exclusive OR gate 67 outputs to the control unit 61 a high-level signal as the inspection result signal D.

With the reconfigurable circuit according to the present embodiment, when the abnormal state is detected, in order to refresh the resistive switching element, the configuration signal C output from the control unit 61 is set to C=1, such that the mode is switched to the configuration mode. That is, when the abnormal state is detected, the programming voltage is applied across the opposite electrodes of the resistive switching element such that the resistive state of the resistive switching element becomes the programmed resistive state.

In the configuration mode (C=1), the voltage control unit 64 outputs the voltage control signals CV1 and CV2 for allowing the programming driver 11 to output the programming voltage. Here, since the programming voltages Von and Voff are higher than the voltage Vmdl in the inspection mode, the determination standard for determining the state of the resistive switching element (that is, whether it is in the ON state or the OFF state correctly) changes. Vph shown in FIG. 6 is the voltage of the reference signal R in the ON state in the configuration mode. When the voltage of the test input TI is higher than Vph, it means that the resistive switching element is normally programmed to the ON state. On the other hand, Vpl shown in FIG. 6 is the voltage of the reference signal R in the OFF state in the configuration mode. When the voltage of the test input TI is lower than Vpl, it means that the resistive switching element is normally programmed to the OFF state.

Here, the relationship Vth<Vph, and Vtl<Vpl are established. In the configuration mode also, when the resistive switching element is in the normal state, the exclusive OR gate 67 outputs to the control unit 61 a low-level signal as the inspection result signal D.

Figure 7:
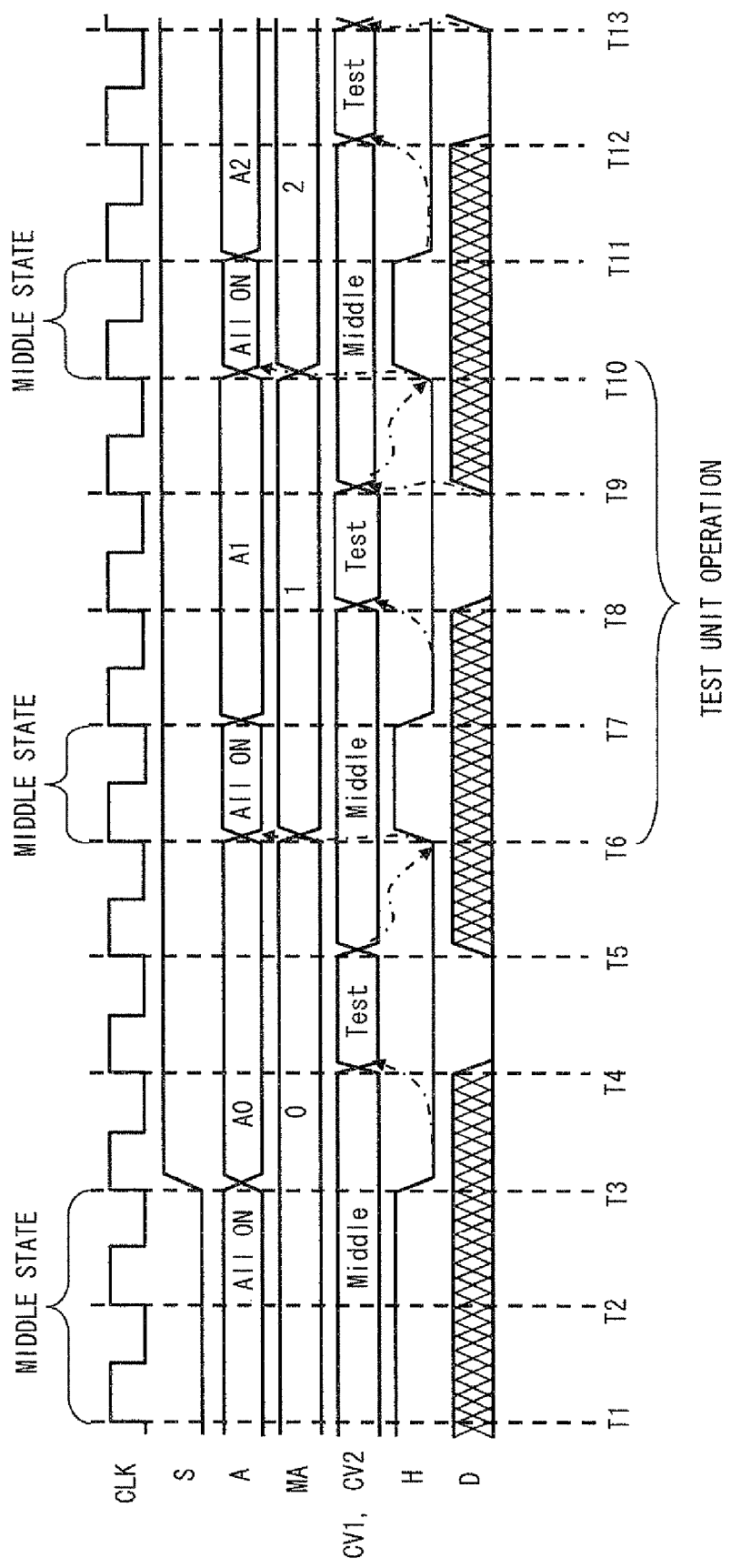
FIG. 7 is a timing chart showing a refresh operation of the reconfigurable circuit according to the first embodiment (when normal).

Next, an explanation will be given of the operation of the reconfigurable circuit according to the present embodiment. FIG. 7 is a timing chart showing the refresh operation of the reconfigurable circuit according to the present embodiment. The timing chart of FIG. 7 shows the operation performed in the case where it is determined to be normal in the inspection mode of the resistive switching elements.

As shown in FIG. 7, at timing from T1 to T3, since the start signal S is at the low level, the reconfigurable circuit is in the middle state. That is, all the programming transistors 3 and 4 are in the ON state, and the programming address A (that is, the address information RA, CA1 and CA2) and the voltage control signals CV1 and CV2 that allow all the programming drivers 11 to output the middle voltage Vmdl are output. "All ON" in FIG. 7 means that all the programming transistors are in the ON state, and "Middle" means that all the programming drivers 11 output the middle voltage Vmdl. The middle state is realized by the control unit 61 shown in FIG. 4 outputting a mode signal H=1.

Then, at timing T3, when the start signal S rises to the high level, the inspection mode starts. That is, when the start signal S rises, the mode signal H becomes H=0, and a programming address A0, which corresponds to the memory address MA=0 output from the control unit 61, is output.

Then, at timing T4, which is one clock later than falling of the mode signal H, the voltage control signals CV1 and CV2 become the inspection-purpose voltage control signals CV1 and CV2 (that is, the signals corresponding to C=0 voltage in FIG. 5), and the inspection state is entered. In connection with CV1 and CV2 in FIG. 7, each part indicated as "Test" means that the inspection-purpose voltage is applied to the resistive switching elements. Further, in FIG. 7, the dashed-dotted line arrows each drawn from a cause event to a result event, showing what event is caused by what event.

At timing T5, that is, at the timing at which the clock CLK rises at the end of the inspection state, when the control unit 61 is supplied with a low-level signal as the inspection result signal D, the resistive switching element corresponding to the programming address A0 is determined to be in the normal state (that is, the resistive state is normal). When the resistive switching element corresponding to the programming address A0 is determined to be normal, the voltage control signals CV1 and CV2 become the voltage control signals CV1 and CV2 corresponding to the middle voltage Vmdl.

Then, at the timing (T6), which is one clock later than the timing at which the middle voltage Vmdl is output, the mode signal H becomes H=1, and again the middle state is entered. At this time, all the programming transistors 3 and 4 enter the ON state, and the programming address A (that is, the address information RA, CA1 and CA2) and the voltage control signals CV1 and CV2 which allow all the programming drivers 11 to output the middle voltage Vmdl are output. Further, at timing T6 at which the middle state is entered, the memory address MA output from the control unit 61 is incremented, to become MA=1.

The operations following timing T7 are similar to those following the aforementioned timing T3, and continue until the inspection of all the resistive switching elements ends. Here, a series of operations from the middle state to the next middle state (T6 to T10) is referred to as the test unit operation. The inspection of the resistive switching elements is performed by repetitively performing the test unit operation while incrementing the memory address MA.

Figure 8:
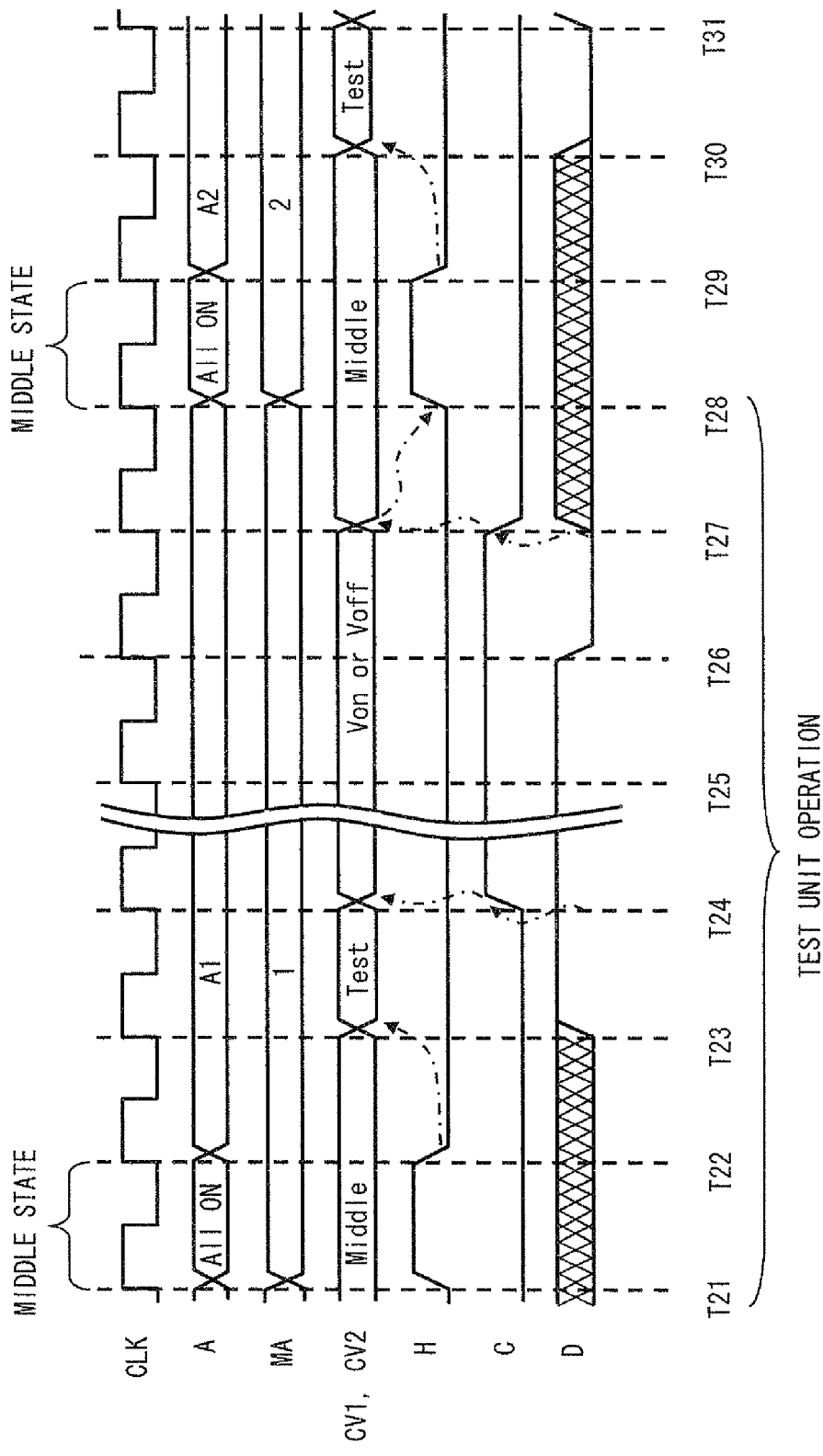
FIG. 8 is a timing chart showing a refresh operation of the reconfigurable circuit according to the first embodiment (when detected to be abnormal).

Next, with reference to the timing chart of FIG. 8, an explanation will be given of the operation performed in the case where it is determined to be abnormal in the inspection mode of the resistive switching elements. The timing chart of FIG. 8 shows the case where it is detected to be abnormal in the test operation unit of the memory address MA=1. Since the operations from T21 to T23 are similar to those shown in the timing chart of FIG. 7, the same explanation will not be repeated.

At timing T24, that is, at the timing at which the clock CLK rises at the end of the inspection state, when the control unit 61 is supplied with a high-level signal as the inspection result signal D, the resistive switching element corresponding to a programming address A1 is determined to be in the abnormal state (that is, the resistive state is abnormal). When the resistive switching element corresponding to the programming address A1 is determined to be abnormal, the configuration signal C rises and the configuration mode is entered. At this time, the voltage control signals CV1 and CV2 become the voltage control signals CV1 and CV2 that generate the programming voltage (Von or Voff). Then, the programming voltage is applied across the opposite electrodes of the resistive switching element corresponding to the programming address A1.

For example, when the resistive switching element should be in the ON state (M=0), the programming voltage Von is applied to the anode side of the resistive switching element, and the programming voltage Vgnd is applied to the cathode side. On the other hand, when the resistive switching element should be in the OFF state (M=1), the programming voltage Vgnd is applied to the anode side of the resistive switching element, and the programming voltage Voff is applied to the cathode side.

The configuration mode continues until a low-level signal is supplied as the inspection result signal D, that is, until programming is correctly performed. Then, after timing T26 at which the inspection result signal D becomes the low level, at the timing (T27) at which the next clock CLK rises, the configuration signal C falls, and the inspection mode is again entered. At this timing T26, the voltage control signals CV1 and CV2 become the voltage control signals CV1 and CV2 corresponding to the middle voltage Vmdl.

Then, at timing T28, which is one clock later than the timing at which the middle voltage Vmdl is output, the mode signal H becomes H=1, and again the middle state is entered. Further, at timing T28 at which the middle state is entered, the memory address MA output from the control unit 61 is incremented and becomes MA=2. Then, again the test unit operation starts.

With the reconfigurable circuit according to the present embodiment explained in the foregoing, since the resistive switching element determined to be abnormal on the inspection is reprogrammed, the reliability of the reconfigurable circuit can be improved, and furthermore the stability of the operation can be improved. Further, with the reconfigurable circuit according to the present embodiment, only the resistive switching element determined to be abnormal on inspection is reprogrammed. Hence, the power consumption in performing the refresh operation can be suppressed.

That is, great power is required for programming the resistive switching elements. Therefore, with the method in which the resistive switching elements are simply reconfigured without being inspected, those resistive switching elements not requiring programming are also reprogrammed and hence power is wastefully consumed. Accordingly, it is desirable that the minimum possible numbers of resistive switching elements are reprogrammed. Hence, by reprogramming only the resistive switching element determined to be abnormal on inspection as in the reconfigurable circuit according to the present embodiment, the power consumption in performing the refresh operation can be suppressed.

Further, with the reconfigurable circuit according to the present embodiment, within the configuration controller, the inspection of the resistive switching elements and the reprogramming upon the abnormal detection are automatically performed. The circuit can be stored in the chip of the reconfigurable circuit, and does not require any separate external apparatus or manpower. Since the inspection and reprogramming of the resistive switching elements can be performed within the chip of the reconfigurable circuit in this manner, the refresh process of the reconfigurable circuit can be realized simply and at low costs.

Further, when the reconfigurable circuit is structured to be capable of supplying the middle voltage Vmdl, the middle voltage Vmdl can be used in inspecting the resistive switching elements, and it is not necessary to separately provide an inspection-purpose power supply.

As explained in the foregoing, according to the embodiment of the present invention, it becomes possible to provide a reconfigurable circuit that can stably drive despite use of resistive rewritable non-volatile switching elements and a method for refreshing such a reconfigurable circuit.

Second Embodiment

Figure 9:
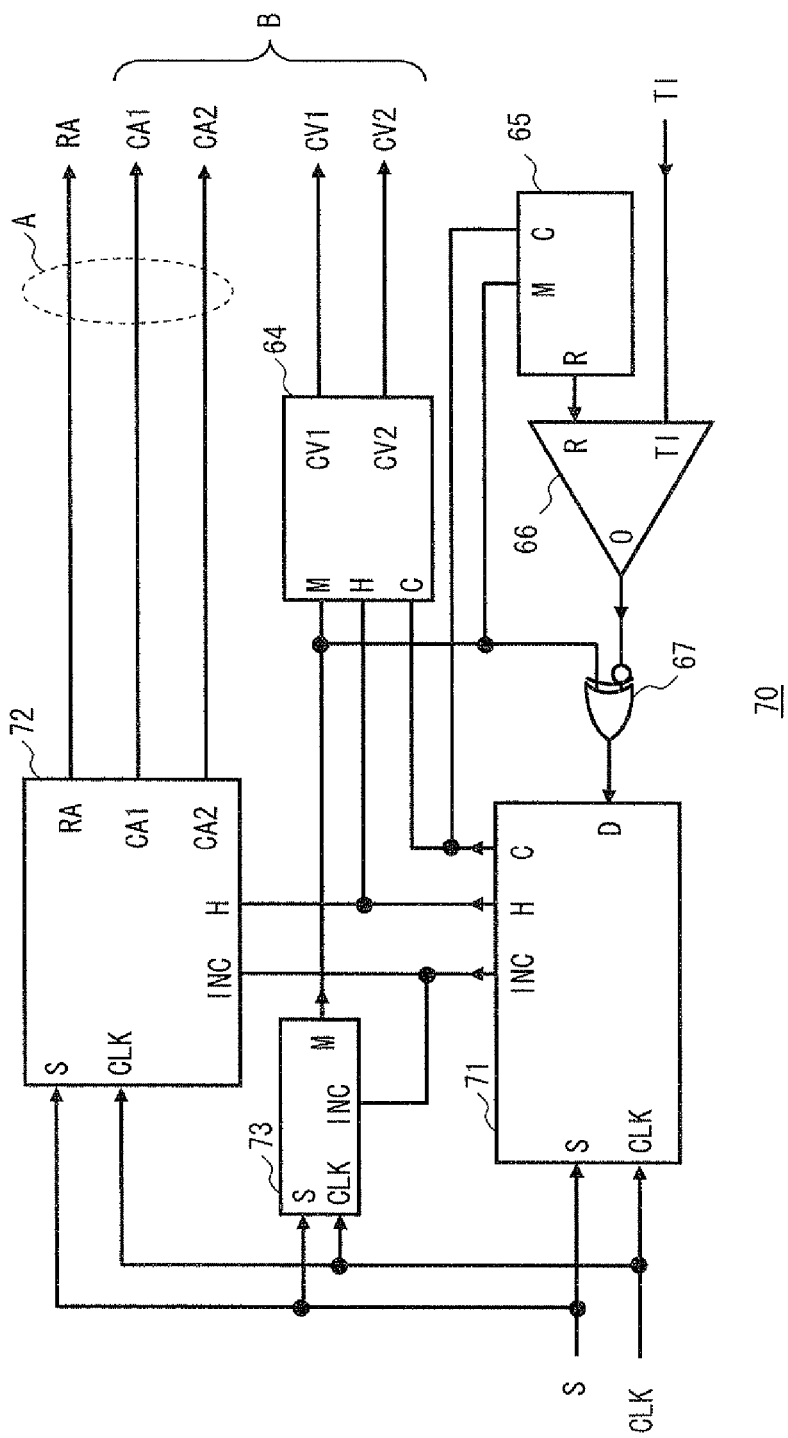
FIG. 9 is a circuit diagram showing a configuration controller included in a reconfigurable circuit according to a second embodiment.

Next, an explanation will be given of a second embodiment of the present invention. FIG. 9 is a diagram showing a configuration controller 70 included in a reconfigurable circuit according to the present embodiment. The reconfigurable circuit according to the present embodiment uses the configuration controller 70 shown in FIG. 9 as the configuration controller. Since other structure and operation are similar to those of the reconfigurable circuit explained in connection with the first embodiment, identical constituents are denoted by identical reference signs, and the same explanation will not be repeated.

In the configuration controller 70 shown in FIG. 9, the control unit 61 of the configuration controller 60 shown in FIG. 4 is replaced by a control unit 71, and the configuration memory 62 and the address gate 63 are respectively replaced by an address generating unit 72 and a state information memory (storage means) 73. Note that the structure and operation of the voltage control unit 64, the reference signal generating unit 65, the comparator 66, and the exclusive OR gate 67 included in the configuration controller 70 shown in FIG. 9 are similar to those of the configuration controller 60 (FIG. 4) explained in the first embodiment.

The control unit 71 operates in synchronization with a clock signal CLK supplied to an input terminal CLK. Further, the control unit 71 starts to operate when a start signal S supplied to an input terminal S becomes the high level. The control unit 71 outputs: an address increment signal INC to the address generating unit 72 and the state information memory 73; a mode signal H to the address generating unit 72 and the voltage control unit 64; and a configuration signal C to the voltage control unit 64 and the reference signal generating unit 65.

The address generating unit 72 is a circuit provided with counters, and operates in synchronization with the clock signal CLK. When the start signal S is at the low level, all the counters are reset. When the start signal S is at the high level, reset is released. The address increment signal INC provided to the address generating unit 72 is a signal that is used in place of the memory address MA in the first embodiment. The address increment signal INC becomes INC=1 at rising of the clock at which the memory address MA changes, and becomes INC=0 at other timing. In other words, the address increment signal INC is a signal for the control unit 71 to notify a change of the memory address MA.

The address generating unit 72 increments the internal counters only when the address increment signal INC=1, to generate the address (that is, RA, CA1 and CA2 being the programming address A). Note that, in the address generating unit 72, no counters count up when the address increment signal INC=0. Then, the address generating unit 72 outputs the generated programming address A.

The state information memory 73 is also a circuit provided with counters similarly to the address generating unit 72, and operates in synchronization with the clock signal CLK. When the start signal S is at the low level, all the counters are reset. When the start signal S is at the high level, reset is released.

The state information memory 73 also receives the address increment signal INC, and only when the address increment signal INC=1, the state information memory 73 increments the internal counters to generate the address. In this case also, no counters count up when the address increment signal INC=0.

The state information memory 73 stores program state information M indicative of the program state of the resistive switching element corresponding to the generated address. Then, the state information memory 73 outputs the program state information M corresponding to the generated address to the voltage control unit 64.

Note that, similarly to the configuration memory 62 according to the first embodiment, the state information memory 73 may be structured to include no counters, and to externally receive the memory address MA and output the program state information M corresponding to the memory address. In this case, the control unit 71 is structured so as to be capable of generating the memory address MA, and outputting the memory address MA to the state information memory 73.

Since the structure and operation other than those described above is similar to those of the reconfigurable circuit explained in connection with the first embodiment and, therefore, the same explanation will not be repeated.

With the configuration controller 60 explained in the first embodiment, the programming address A is retained in the configuration memory 62. Accordingly, a large-capacity memory becomes necessary as the configuration memory 62.

On the other hand, with the configuration controller 70 according to the present embodiment, the programming address A is generated by the address generating unit 73 that uses the counters. That is, since the programming address A has regularity, it can be realized by a small number of counters and logic circuits associated with them. Thus, since the configuration controller 70 according to the present embodiment is only required to include solely the state information memory 73 retaining the program state information M as the memory, the circuit area can be reduced as compared to the structure of the first embodiment in which a memory is used for retaining the programming address A.

Third Embodiment

Figure 10:
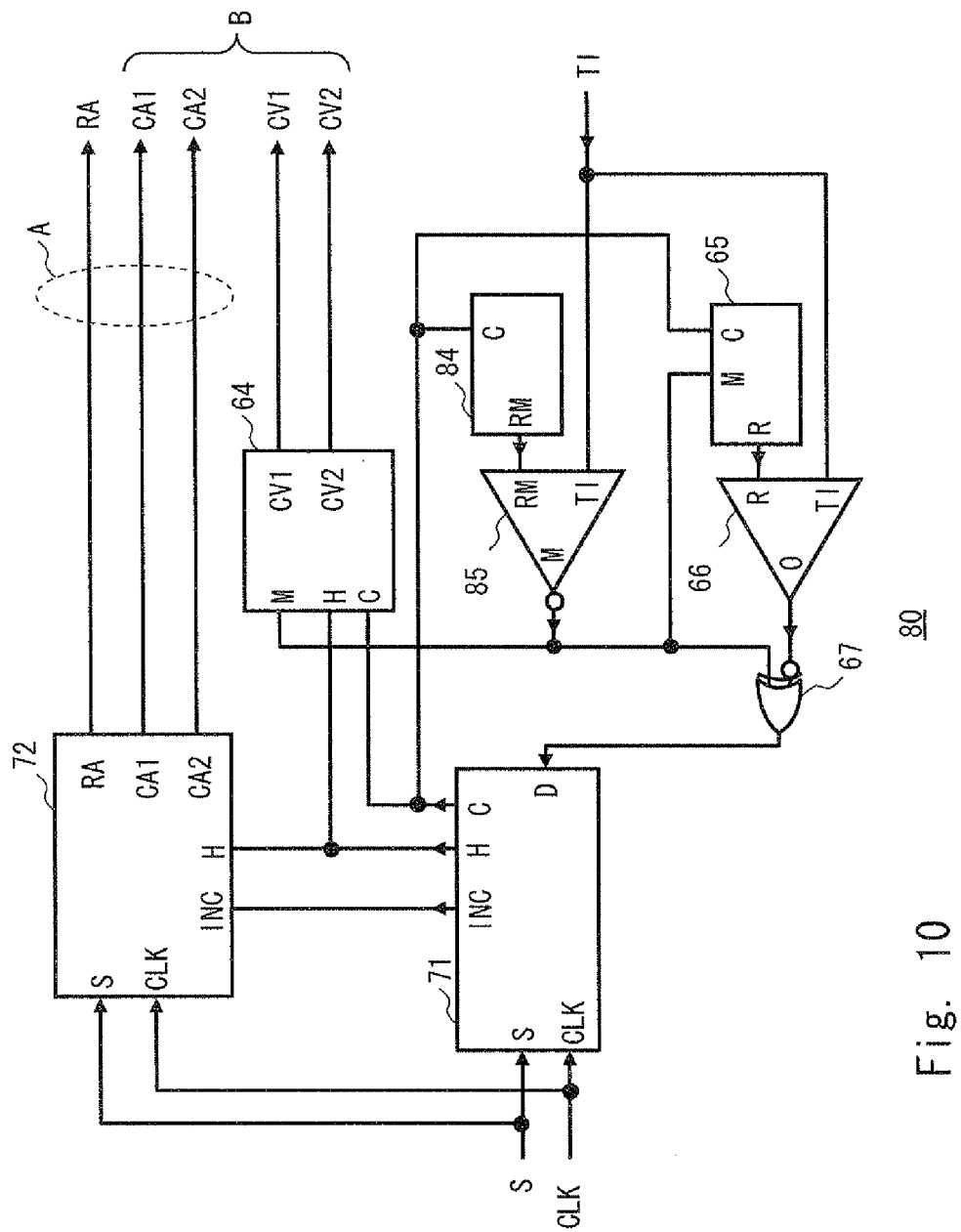
FIG. 10 is a circuit diagram showing a configuration controller included in a reconfigurable circuit according to a third embodiment.

Next, an explanation will be given of a third embodiment of the present invention. FIG. 10 is a diagram showing a configuration controller 80 included in a reconfigurable circuit according to the present embodiment. The reconfigurable circuit according to the present embodiment uses a configuration controller 80 shown in FIG. 10 as the configuration controller. Since the structure and operation other than those are similar to those of the reconfigurable circuit explained in connection with the first and second embodiments, identical constituents are denoted by identical reference signs, and the same explanation will not be repeated.

In the configuration controller 80 shown in FIG. 10, the state information memory 73 of the configuration controller 70 shown in FIG. 9 is replaced by a comparator 85 and a reference signal generating unit 84. Note that, the structure and operation of the voltage control unit 64, the reference signal generating unit 65, the comparator 66, and the exclusive OR gate 67 included in the configuration controller 80 shown in FIG. 10 are similar to those of the configuration controller 60 (FIG. 4) explained in connection with the first embodiment. Further, the structure and operation of the control unit 71 and the address generating unit 72 included in the configuration controller 80 shown in FIG. 10 are similar to those of the configuration controller 80 (FIG. 9) explained in connection with the second embodiment.

The program state information M indicates the state of each resistive switching element (that is, whether it is the ON state or the OFF state) in accordance with an application circuit that performs mapping to the reconfigurable circuit. In general, since the resistive state of each resistive switching element gradually deteriorates, the resistance r of the resistive switching element is in the indefinite state in the situation where deterioration has not been progressed much.

That is, the resistive switching element that should be in the normal ON state (r<rl) enters the weak ON state (rl<r<rm) due to deterioration. Further, the resistive switching element that should be in the normal OFF state (rh<r) enters the weak OFF state (rm<r<rh) due to deterioration. Here, the resistance rl is the reference resistance value for determining that the resistive switching element is in the normal ON state. The resistance rh is the reference resistance value for determining that the resistive switching element is in the normal OFF state. The resistance rm is the resistance value between the resistance rh and the resistance rl.

Accordingly, in the situation where deterioration has not been progressed much, when the resistance r of a resistive switching element is lower than the middle resistance rm, it is determined that the resistive switching element is the element that should originally be in the normal ON state, and the resistive switching element is reprogrammed such that the resistance r of the resistive switching element becomes lower than rl.

Further, when the resistance r of a resistive switching element is higher than the middle resistance rm, it is determined that the resistive switching element is the element that should originally be in the normal OFF state, and the resistive switching element is reprogrammed such that the resistance r of the resistive switching element becomes lower than rh. Thus, the resistive switching elements can be set to the original correct state.

The reference signal generating unit 84 and the comparator 85 generates a signal indicative of whether the resistance r of the resistive switching element is higher or lower than rm. The signal indicative of whether the resistance r is higher or lower than rm is a signal corresponding to the program state information M in the first and second embodiments. When deterioration of the resistive switching element has not been progressed much, the output of the comparator 85 agrees with the program state information M. That is, when the resistance r of a resistive switching element is higher than rm, the resistive switching element is determined to be the element that should originally be in the normal OFF state. On the other hand, when the resistance r of a resistive switching element is lower than rm, the resistive switching element is determined to be the element that should originally be in the normal ON state.

Figures 11, 12:
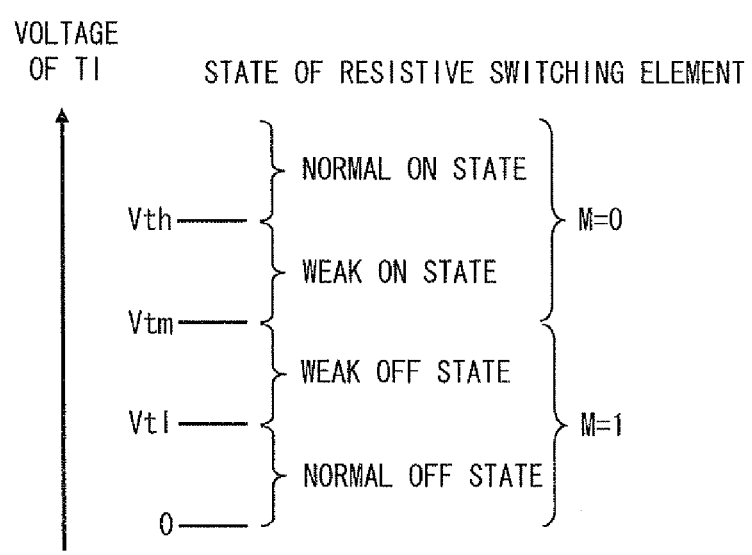
FIG. 11 is a table showing the relationship between the configuration signal C and an output voltage RM of the reference signal generating unit.
FIG. 12 is a diagram showing the relationship among the voltage of a test input TI, the state of a resistive switching element, an output voltage R (Vtl, Vth) of a reference signal generating unit 65, an output voltage RM (voltage Vtm) of a reference signal generating unit 84, and an output signal M of a comparator 85, in an inspection mode.

The reference signal generating unit 84 outputs an output voltage RM corresponding to the configuration signal C to an input terminal RM of the comparator 85. FIG. 11 shows the relationship between the configuration signal C and the output voltage RM of the reference signal generating unit 84. The comparator 85 compares the output voltage RM output from the reference signal generating unit 84 and the voltage of the test input TI with each other. When the voltage of the test input TI is higher than the output voltage RM, the comparator 85 outputs a low-level signal. When the voltage of the test input TI is lower than the output voltage RM, the comparator 85 outputs a high-level signal.

That is, in the inspection mode (C=0), when the voltage of the test input TI is higher than Vtm (the third voltage), the comparator 85 determines that the resistance of the resistive switching element being the inspection target is lower than rm. In this case, the comparator 85 outputs a low-level signal. This signal corresponds to the program state information M=0. On the other hand, when the voltage of the test input TI is lower than Vtm, the comparator 85 determines that the resistance of the resistive switching element being the inspection target is higher than rm. In this case, the comparator 85 outputs a high-level signal. This signal corresponds to the program state information M=1.

In the programming mode (C=1), when the voltage of the test input TI is higher than Vpm, the comparator 85 determines that the resistance of the resistive switching element being the inspection target is lower than rm. In this case, the comparator 85 outputs a low-level signal. This signal corresponds to the program state information M=0. On the other hand, when the voltage of the test input TI is lower than Vpm, the comparator 85 determines that the resistance of the resistive switching element being the inspection target is higher than rm. In this case, the comparator 85 outputs a high-level signal. This signal corresponds to the program state information M=1.

FIG. 12 shows the relationship, in the inspection mode (C=0), among the voltage of the test input TI, the state of the resistive switching element, the output voltage R (Vtl, Vth) of the reference signal generating unit 65, the output voltage RM (voltage Vtm) of the reference signal generating unit 84, and the output signal M of the comparator 85. Note that, in the programming mode (C=1), Vtl, Vth and Vtm become Vpl, Vph and Vpm, respectively.

As shown in FIG. 12, when the voltage of the test input TI is higher than Vtm, the program state information M indicates the ON state (M=0). Further, when the voltage of the test input TI is higher than Vth, the normal ON state is indicated; and when the voltage of the test input TI is higher than Vtm and lower than Vth, the weak ON state (that is, the ON state with progressed deterioration) is indicated.

On the other hand, as shown in FIG. 12, when the voltage of the test input TI is lower than Vtm, the program state information M indicates the OFF state (M=1). Further, when the voltage of the test input TI is lower than Vtl, the normal OFF state is indicated. When the voltage of the test input TI is higher than Vtl and lower than Vtm, the weak OFF state (that is, the OFF state with progressed deterioration) is indicated.

As explained above, with the reconfigurable circuit according to the present embodiment, the program state information M is generated using the reference signal generating unit 84 and the comparator 85. The structure and operation other than those are similar to those of the reconfigurable circuit explained in connection with the first and second embodiments and, therefore, the same explanation will not be repeated.

Since the configuration controller 70 explained in the second embodiment includes the state information memory 73 for retaining the program state information M, the circuit area is increased by that amount. In contrast, with the configuration controller 80 included in the reconfigurable circuit according to the present embodiment, the circuit area of the configuration controller 80 can be reduced because the state information memory 73 is not used.

That is, since the reconfigurable circuit according to the present embodiment does not require a memory for retaining the information relating to the configuration, the circuit area can be reduced as compared to the reconfigurable circuit according to the other embodiments. Further, since the memory is associated with great leakage current, the power consumption is great with the reconfigurable circuit including a memory. On the other hand, since the reconfigurable circuit according to the present embodiment does not include any memory, the power consumption can be reduced by the amount which would otherwise be required by the memory.

Note that the present invention is not limited to the embodiments described above, and can be changed as appropriate within the range not departing from the gist of the present invention. For example, the logical values of the signals shown in FIGS. 3, 5, and 6 are merely an example, and the logical values allotted to the signals can be determined arbitrarily.

In the foregoing, while the present invention has been explained in terms of embodiments, the present invention is not limited only to the structure according to the embodiments above. It goes without saying that the present invention includes various changes, modifications and combinations that can be practiced by those skilled in the art within the scope of claims of the present invention.

Part or all of the embodiments above can also be described as follows. However, the present invention is not limited thereto.

(Appendix 1) A reconfigurable circuit comprising:
a switching element group that is formed by a plurality of switching elements disposed in a manner of a two-dimensional array, a resistive state of each of the switching elements being programmable in accordance with a voltage applied across opposite electrodes of the switching element, an ON state and an OFF state of the switching element being rewritable in accordance with the resistive state; and
a configuration controller that senses the resistive state of each of the switching elements and programs each switching element, wherein
the configuration controller senses the resistive state of each switching element by applying an inspection-purpose voltage across the opposite electrodes of the switching element, the inspection-purpose voltage substantially maintaining the ON state and the OFF state of the switching element unchanged, and
when the sensed resistive state is abnormal, the configuration controller applies a programming voltage across the opposite electrodes of the switching element such that the resistive state of the switching element becomes the programmed resistive state.

(Appendix 2) The reconfigurable circuit according to Appendix 1, wherein
the configuration controller includes:
address generating means for generating an address corresponding to the switching element applied with the inspection-purpose voltage and the programming voltage;
voltage control means for applying the inspection-purpose voltage and the programming voltage to the switching element;
sensing means for sensing the resistive state of the switching element when the inspection-purpose voltage is applied across the opposite electrodes of the switching element; and
control means for controlling the address generating means, the voltage control means and the sensing means.

(Appendix 3) The reconfigurable circuit according to Appendix 2, wherein
the configuration controller further includes storage means, and
the storage means retains information as to which one of the ON state and the OFF state the switching element is programmed to.

(Appendix 4) The reconfigurable circuit according to Appendix 3, wherein the storage means included in the configuration controller retains address information used by the address generating means.

(Appendix 5) The reconfigurable circuit according to Appendix 2 or 3, wherein the address generating means includes a counter, and the address is generated by incrementing a count value in accordance with an address increment signal being output from the control means.

(Appendix 6) The reconfigurable circuit according to any one of Appendixes 1 to 5, wherein the configuration controller applies, in sensing the resistive state of the switching element, the inspection-purpose voltage to an anode side of the switching element and applies a ground voltage to a cathode side when the switching element is programmed to the ON state, and the configuration controller applies, in sensing the resistive state of the switching element, the ground voltage to the anode side of the switching element and applies the inspection-purpose voltage to the cathode side when the switching element is programmed to the OFF state.

(Appendix 7) The reconfigurable circuit according to Appendix 6, wherein the configuration controller uses, in sensing the resistive state of the switching element, a test voltage to sense the resistive state of the switching element, the test voltage being a voltage of an electrode applied with the ground voltage, out of an anode electrode and a cathode electrode provided to the switching element.

(Appendix 8) The reconfigurable circuit according to Appendix 7, wherein the configuration controller determines, in sensing the resistive state of the switching element, abnormality if the test voltage is lower than a prescribed first voltage when the switching element is programmed to the ON state, and the configuration controller determines, in sensing the resistive state of the switching element, abnormality if the test voltage is higher than a prescribed second voltage when the switching element is programmed to the OFF state.

(Appendix 9) The reconfigurable circuit according to Appendix 7 or 8, wherein the configuration controller determines that the switching element is programmed to the ON state when the test voltage is higher than a prescribed third voltage, and the configuration controller determines that the switching element is programmed to the OFF state when the test voltage is lower than the prescribed third voltage.

(Appendix 10) The reconfigurable circuit according to any one of Appendixes 1 to 9, wherein the configuration controller refreshes the reconfigurable circuit by sensing the resistive state of each of the switching elements and programming each switching element upon power-on of the reconfigurable circuit or in a period where the reconfigurable circuit is unused.

(Appendix 11) The reconfigurable circuit according to any one of Appendixes 1 to 10, wherein the configuration controller applies, in applying the programming voltage to the switching element, an ON voltage being higher than the inspection-purpose voltage to the anode side of the switching element and applies a ground voltage to the cathode side, when the switching element is to be programmed to the ON state, and the configuration controller applies, in applying the programming voltage to the switching element, the ground voltage to the anode side of the switching element and applies an OFF voltage being higher than the inspection-purpose voltage and lower than the ON voltage to the cathode side, when the switching element is to be programmed to the OFF state.

(Appendix 12) A method for refreshing a reconfigurable circuit, wherein the reconfigurable circuit includes:

a switching element group that is formed by a plurality of switching elements disposed in a manner of a two-dimensional array, a resistive state of each of the switching elements being programmable in accordance with a voltage applied across opposite electrodes of the switching element, an ON state and an OFF state of the switching element being rewritable in accordance with the resistive state; and a configuration controller that senses the resistive state of each of the switching elements and programs each switching element, wherein the configuration controller senses the resistive state of each switching element by applying an inspection-purpose voltage across the opposite electrodes of the switching element, the inspection-purpose voltage substantially maintaining the ON state and the OFF state of the switching element unchanged, and when the sensed resistive state is abnormal, the configuration controller applies a programming voltage across the opposite electrodes of the switching element such that the resistive state of the switching element becomes the programmed resistive state.

(Appendix 13) The method for refreshing a reconfigurable circuit according to Appendix 12, wherein the configuration controller uses information as to which one of the ON state and the OFF state the switching element is programmed to, to determine the inspection-purpose voltage and the programming voltage to be applied to the switching element.

(Appendix 14) The method for refreshing a reconfigurable circuit according to Appendix 12 or 13, wherein the configuration controller applies, in sensing the resistive state of the switching element, the inspection-purpose voltage to an anode side of the switching element and applies a ground voltage to a cathode side when the switching element is programmed to the ON state, and the configuration controller applies, in sensing the resistive state of the switching element, the ground voltage to the anode side of the switching element and applies the inspection-purpose voltage to the cathode side when the switching element is programmed to the OFF state.

(Appendix 15) The method for refreshing a reconfigurable circuit according to Appendix 14, wherein the configuration controller uses, in sensing the resistive state of the switching element, a test voltage to sense the resistive state of the switching element, the test voltage being a voltage of an electrode applied with the ground voltage, out of an anode electrode and a cathode electrode provided to the switching element.

(Appendix 16) The method for refreshing a reconfigurable circuit according to Appendix 15, wherein the configuration controller determines, in sensing the resistive state of the switching element, abnormality if the test voltage is lower than a prescribed first voltage when the switching element is programmed to the ON state, and the configuration controller determines, in sensing the resistive state of the switching element, abnormality if the test voltage is higher than a prescribed second voltage when the switching element is programmed to the OFF state.

(Appendix 17) The method for refreshing a reconfigurable circuit according to Appendix 15 or 16, wherein the configuration controller determines that the switching element is programmed to the ON state when the test voltage is higher than a prescribed third voltage, and the configuration controller determines that the switching element is programmed to the OFF state when the test voltage is lower than the prescribed third voltage.

(Appendix 18) The method for refreshing a reconfigurable circuit according to any one of Appendixes 12 to 17, wherein
the configuration controller refreshes the reconfigurable circuit by sensing the resistive state of each of the switching elements and programming each switching element upon power-on of the reconfigurable circuit or in a period where the reconfigurable circuit is unused.

The present application claims priority to Japanese Patent Application No. 2011-044964 filed on Mar. 2, 2011, the disclosure of which is incorporated herein in its entirety.

REFERENCE SIGNS LIST

1_1 to 1_3, 2_1 to 2_3 RESISTIVE SWITCHING ELEMENT
3_1 to 3_3, 4_1 to 4_3 PROGRAMMING TRANSISTOR
5_1 to 5_3 PROGRAMMING LINE
6_1 to 6_4, 7_1 to 7_4 WIRING
8_1, 8_2 GATE LINE
10 RECONFIGURABLE CIRCUIT
11_1 to 11_3 PROGRAMMING DRIVER
12_1, 12_2 PROGRAMMING DECODER
13, 14 LINE
21 DRIVER DECODER
22 POWER SUPPLY CONTROL TRANSISTOR
23 TEST TRANSISTOR
60 CONFIGURATION CONTROLLER
61, 71 CONTROL UNIT
62 CONFIGURATION MEMORY
63 ADDRESS GATE
64 VOLTAGE CONTROL UNIT
65 REFERENCE SIGNAL GENERATING UNIT
66 COMPARATOR
67 EXCLUSIVE OR GATE
70 CONFIGURATION CONTROLLER
72 ADDRESS GENERATING UNIT
73 STATE INFORMATION MEMORY
84 REFERENCE SIGNAL GENERATING UNIT
85 COMPARATOR
70, 80 CONFIGURATION CONTROLLER

What is claimed is:

1. A reconfigurable circuit comprising:
a switching element group that is formed by a plurality of switching elements disposed in a manner of a two-dimensional array, a resistive state of each of the switching elements being programmable in accordance with a voltage applied across opposite electrodes of the switching element, an ON state and an OFF state of the switching element being rewritable in accordance with the resistive state; and
a configuration controller that senses the resistive state of each of the switching elements and programs each switching element, wherein
the configuration controller senses the resistive state of each switching element by applying an inspection-purpose voltage across the opposite electrodes of the switching element, the inspection-purpose voltage substantially maintaining the ON state and the OFF state of the witching element unchanged,
when the sensed resistive state is abnormal, the configuration controller applies a programming voltage across the opposite electrodes of the switching element such that the resistive state of the switching element becomes the programmed resistive state;
the configuration controller applies, in sensing the resistive state of the switching element, the inspection-purpose voltage to an anode side of the switching element and applies a ground voltage to a cathode side when the switching element is programmed to the ON state, and
the configuration controller applies, in sensing the resistive state of the switching element, the ground voltage to the anode side of the switching element and applies the inspection-purpose voltage to the cathode side when the switching element is programmed to the OFF state.

2. The reconfigurable circuit according to claim 1, wherein the configuration controller includes:
address generating unit for generating an address corresponding to the switching element applied with the inspection-purpose voltage and the programming voltage;
voltage control unit for applying the inspection-purpose voltage and the programming voltage to the switching element;
sensing unit for sensing the resistive state of the switching element when the inspection-purpose voltage is applied across the opposite electrodes of the switching element; and
control unit for controlling the address generating unit, the voltage control unit and the sensing unit.

3. The reconfigurable circuit according to claim 2, wherein the configuration controller further includes storage unit, and
the storage unit retains information as to which one of the ON state and the OFF state the switching element is programmed to.

4. The reconfigurable circuit according to claim 2, wherein the address generating unit includes a counter, and
the address is generated by incrementing a count value in accordance with an address increment signal being output from the control unit.

5. The reconfigurable circuit according to claim 1, wherein the configuration controller uses, in sensing the resistive state of the switching element, a test voltage to sense the resistive state of the switching element, the test voltage being a voltage of an electrode applied with the ground voltage, out of an anode electrode and a cathode electrode provided to the switching element.

6. The reconfigurable circuit according to claim 5, wherein the configuration controller determines, in sensing the resistive state of the switching element, abnormality if the test voltage is lower than a prescribed first voltage when the switching element is programmed to the ON state, and
the configuration controller determines, in sensing the resistive state of the switching element, abnormality if the test voltage is higher than a prescribed second voltage when the switching element is programmed to the OFF state.

7. The reconfigurable circuit according to claim 5, wherein the configuration controller determines that the switching element is programmed to the ON state when the test voltage is higher than a prescribed third voltage, and
the configuration controller determines that the switching element is programmed to the OFF state when the test voltage is lower than the prescribed third voltage.

8. The reconfigurable circuit according to claim 1, wherein the configuration controller refreshes the reconfigurable circuit by sensing the resistive state of each of the switching elements and programming each switching element upon power-on of the reconfigurable circuit or in a period where the reconfigurable circuit is unused.

9. A method for refreshing a reconfigurable circuit, wherein
the reconfigurable circuit includes:
a switching element group that is formed by a plurality of switching elements disposed in a manner of a two-dimensional array, a resistive state of each of the switching elements being programmable in accordance with a voltage applied across opposite electrodes of the switching element, an ON state and an OFF state of the switching element being rewritable in accordance with the resistive state; and
a configuration controller that senses the resistive state of each of the switching elements and programs each switching element, wherein
the configuration controller senses the resistive state of each switching element by applying an inspection-purpose voltage across the opposite electrodes of the switching element, the inspection-purpose voltage substantially maintaining the ON state and the OFF state of the switching element unchanged,
when the sensed resistive state is abnormal, the configuration controller applies a programming voltage across the opposite electrodes of the switching element such that the resistive state of the switching element becomes the programmed resistive state;
the configuration controller applies, in sensing the resistive state of the switching element, the inspection-purpose voltage to an anode side of the switching element and applies a ground voltage to a cathode side when the switching element is programmed to the ON state, and
the configuration controller applies, in sensing the resistive state of the switching element, the ground voltage to the anode side of the switching element and applies the inspection-purpose voltage to the cathode side when the switching element is programmed to the OFF state.

10. The method for refreshing a reconfigurable circuit according to claim 9, wherein the configuration controller uses information as to which one of the ON state and the OFF state the switching element is programmed to, to determine the inspection-purpose voltage and the programming voltage to be applied to the switching element.

11. The method for refreshing a reconfigurable circuit according to claim 9, wherein
the configuration controller uses, in sensing the resistive state of the switching element, a test voltage to sense the resistive state of the switching element, the test voltage being a voltage of an electrode applied with the ground voltage, out of an anode electrode and a cathode electrode provided to the switching element.

12. The method for refreshing a reconfigurable circuit according to claim 11, wherein
the configuration controller determines, in sensing the resistive state of the switching element, abnormality if the test voltage is lower than a prescribed first voltage when the switching element is programmed to the ON state, and
the configuration controller determines, in sensing the resistive state of the switching element, abnormality if the test voltage is higher than a prescribed second voltage when the switching element is programmed to the OFF state.

13. The method for refreshing a reconfigurable circuit according to claim 11, wherein
the configuration controller determines that the switching element is programmed to the ON state when the test voltage is higher than a prescribed third voltage, and
the configuration controller determines that the switching element is programmed to the OFF state when the test voltage is lower than the prescribed third voltage.

14. The method for refreshing a reconfigurable circuit according to claim 9, wherein
the configuration controller refreshes the reconfigurable circuit by sensing the resistive state of each of the switching elements and programming each switching element upon power-on of the reconfigurable circuit or in a period where the reconfigurable circuit is unused.

15. The reconfigurable circuit according to claim 3, wherein the storage unit included in the configuration controller retains address information used by the address generating unit.

16. The reconfigurable circuit according to claim 1, wherein
the configuration controller applies, in applying the programming voltage to the switching element, an ON voltage being higher than the inspection-purpose voltage to the anode side of the switching element and applies a ground voltage to the cathode side, when the switching element is to be programmed to the ON state, and
the configuration controller applies, in applying the programming voltage to the switching element, the ground voltage to the anode side of the switching element and applies an OFF voltage being higher than the inspection-purpose voltage and lower than the ON voltage to the cathode side, when the switching element is to be programmed to the OFF state.

* * * * *